United States Patent
Gogami et al.

(10) Patent No.: US 6,686,650 B1
(45) Date of Patent: Feb. 3, 2004

(54) NON-CONTACT DATA CARRIER AND IC CHIP

(75) Inventors: Masao Gogami, Shinjuku-Ku (JP); Noboru Araki, Shinjuku-Ku (JP); Yasuko Hirata, Shinjuku-Ku (JP)

(73) Assignee: Dai Nippon Printing Co., Ltd. (JP)

( * ) Notice: Subject to any disclaimer, the term of this patent is extended or adjusted under 35 U.S.C. 154(b) by 12 days.

(21) Appl. No.: 09/831,632

(22) PCT Filed: Oct. 10, 2000

(86) PCT No.: PCT/JP00/07032

§ 371 (c)(1),
(2), (4) Date: May 11, 2001

(87) PCT Pub. No.: WO01/26910

PCT Pub. Date: Apr. 19, 2001

(30) Foreign Application Priority Data

Oct. 8, 1999 (JP) .................................. 11-288481

(51) Int. Cl.⁷ .................................. H01L 23/495
(52) U.S. Cl. .......... 257/666; 257/668; 257/673; 257/778; 257/780; 257/781; 257/783; 257/784; 438/123; 438/614; 438/617
(58) Field of Search .................. 257/666, 668, 257/673, 778, 780, 781, 783, 784; 438/123, 614, 617

(56) References Cited

U.S. PATENT DOCUMENTS

| | | | | |
|---|---|---|---|---|
| 3,835,531 A | * | 9/1974 | Luttmer | 29/625 |
| 5,600,103 A | * | 2/1997 | Odaira et al. | 174/265 |
| 5,656,857 A | * | 8/1997 | Kishita | 257/690 |
| 5,705,852 A | * | 1/1998 | Orihara et al. | 257/679 |
| 5,737,833 A | * | 4/1998 | Motomura et al. | 29/830 |
| 5,821,627 A | * | 10/1998 | Mori et al. | 257/780 |
| 6,194,781 B1 | * | 2/2001 | Ikegami | 257/737 |

FOREIGN PATENT DOCUMENTS

| | | | | |
|---|---|---|---|---|
| JP | 2-110950 | | 4/1990 | |
| JP | 5-144872 | | 6/1993 | |
| JP | 07-153796 | * | 6/1995 | 257/666 |
| JP | 8-287208 | | 11/1996 | |
| JP | 9-68715 | | 3/1997 | |
| JP | 10-233413 | | 9/1998 | |
| JP | 11-53501 | | 2/1999 | |
| JP | 11-175675 | | 7/1999 | |
| JP | 11-353439 | | 12/1999 | |
| JP | 2000-48153 | | 2/2000 | |
| JP | 2000-227954 | | 8/2000 | |

* cited by examiner

Primary Examiner—George Eckert
Assistant Examiner—Edgardo Ortiz
(74) Attorney, Agent, or Firm—Parkhurst & Wendel, L.L.P.

(57) ABSTRACT

The non-contact data carrier has a resin substrate, a metallic antenna coil on the resin substrate, and an IC chip connected to the antenna coil via a plurality of bumps. Each bump of the IC chip has a base on the side of the IC chip body of the data carrier and a projection held by the base via a shoulder. Each bump is connected to the antenna coil by piercing the projection into the antenna coil.

7 Claims, 3 Drawing Sheets

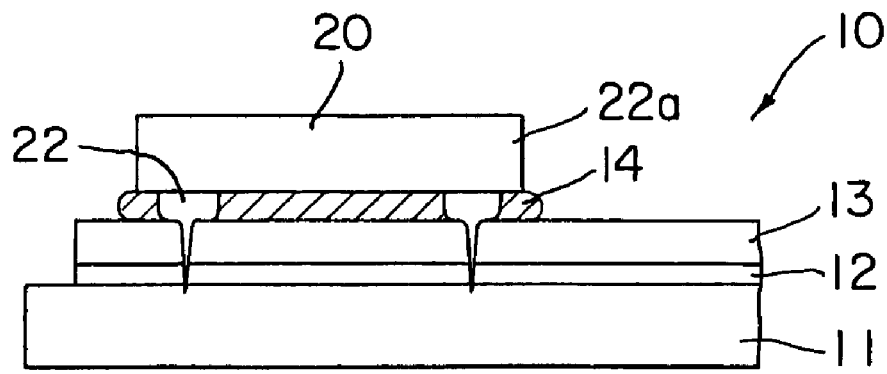
F I G. 5
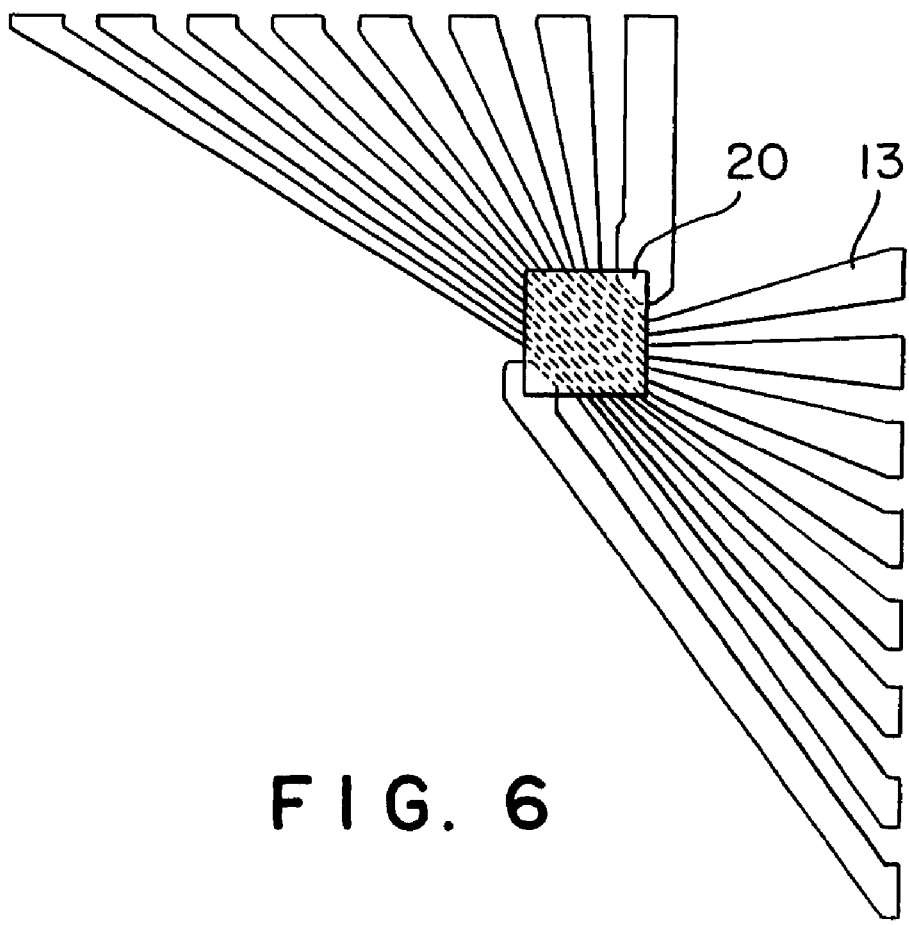
F I G. 6

NON-CONTACT DATA CARRIER AND IC CHIP

BACKGROUND OF THE INVENTION

1. Field of the Invention

The present invention relates to a non-contact data carrier having an antenna coil and an IC chip and an IC chip used for the same and more particularly to a non-contact data carrier and an IC chip for surely realizing continuity between the antenna coil and the IC chip.

2. Description of the Related Art

A non-contact data carrier having an antenna coil and an IC chip is conventionally used in the distribution system. Such a non-contact data carrier is used, for example, by attaching to a shipping box of a product or a product itself.

The non-contact data carrier generally has a resin substrate, a metallic antenna coil installed on the resin substrate, and an IC chip connected to the antenna coil. When electromagnetic waves are sent to the non-contact data carrier from the reader side, an induced current is generated in the antenna coil and operates the IC chip.

The non-contact data carrier, as mentioned above, generally has a metallic antenna coil installed on a resin substrate and an IC chip connected to the antenna coil. The IC chip has an IC bump in contact with the antenna coil and is fixed to the antenna coil by an ACF (anisotropic conductive film) or an inter-metal joint by ultrasonic vibration.

An aluminum antenna coil is at a low cost compared with a copper one, though an aluminum oxide film is formed on its surface, so that the continuity between the antenna coil and the bump may be disturbed. It may be considered to additionally provide a deposit layer composed of a continuity material on the antenna coil surface so as to suppress generation of an aluminum oxide film. However, the plating step for forming a deposit layer is required and the manufacturing step is complicated, resulting in an increase in cost.

SUMMARY OF THE INVENTION

The present invention has been developed in consideration of the aforementioned problems and is intended to provide a non-contact data carrier and an IC chip for simplifying the manufacturing step and surely realizing continuity between the antenna coil and the IC chip even if low-cost aluminum is used.

The present invention is a non-contact data carrier comprising: a substrate, a metallic antenna coil on the substrate, and an IC chip having an IC chip body and a plurality of bumps connected to the antenna coil, wherein each bump of the IC chip has a projection piercing in and connected to the antenna coil and an IC chip to be used in a non-contact data carrier having a metallic antenna coil comprising an IC chip body and a plurality of bumps connected to the IC chip body, wherein each bump has a projection piercing in and connected to the antenna coil.

According to the present invention, each bump of the IC chip is connected to the antenna coil by piercing its projection into the antenna coil.

BRIEF DESCRIPTION OF THE DRAWINGS

FIG. 5 is a drawing showing another embodiment of the non-contact data carrier.

FIG. 6 is an enlarged plan view showing an antenna coil and an IC chip.

DESCRIPTION OF THE PREFERRED EMBODIMENTS

Figure 1:
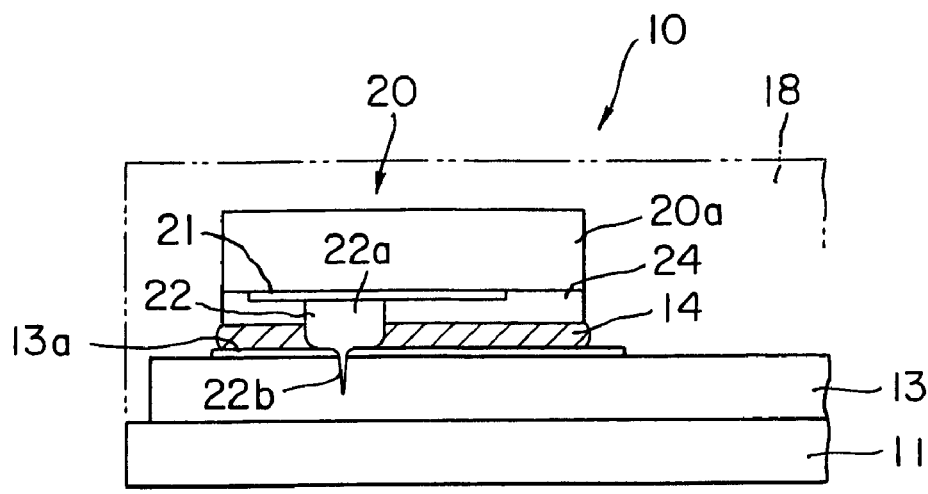
FIG. 1 is a side cross sectional view showing an embodiment of a non-contact data carrier of the present invention.
Figure 2:
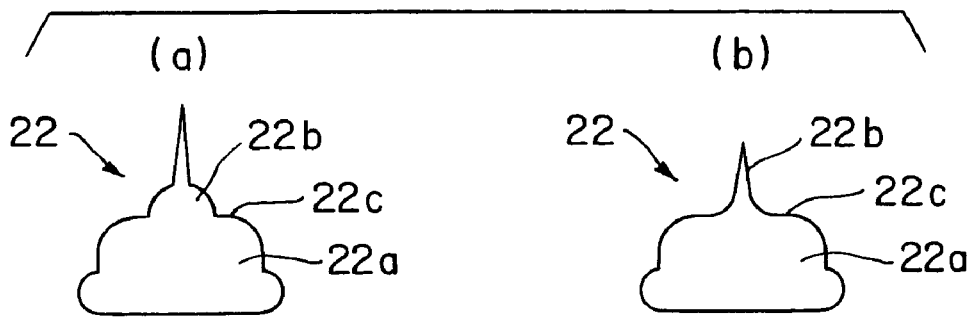
FIG. 2 is an external view showing bumps.

The embodiments of the present invention will be explained hereunder with reference to the accompanying drawings. FIGS. 1 to 4 are drawings showing a non-contact data carrier and an IC chip of the present invention.

As shown in FIGS. 1 to 4, for example, a non-contact data carrier 10, such as an IC card or an IC tag, has a resin substrate 11 made of PET, a metallic antenna coil 13 made of aluminum formed by etching, and an IC chip connected to the antenna coil 13. The etching of the coil 13 is performed by using a resist layer formed almost overall the resin substrate 11 by gravure printing, screen printing, or flexographic printing or a photoresist layer (not shown in the drawing).

The non-contact data carrier 10 having such a constitution is used, for example, by attaching to a shipping box of a product or to a product itself. The IC chip 20 is operated by electromagnetic waves from a reader of a distribution system not shown in the drawing.

Figure 3:
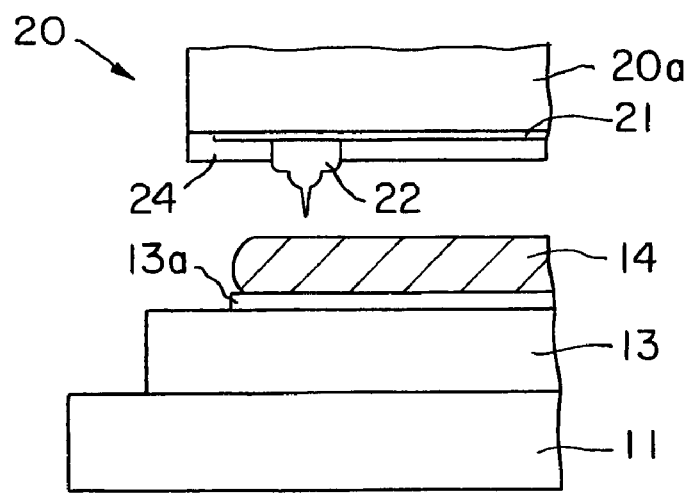
FIG. 3 is an enlarged side view showing an antenna coil and an IC chip.
Figure 4:
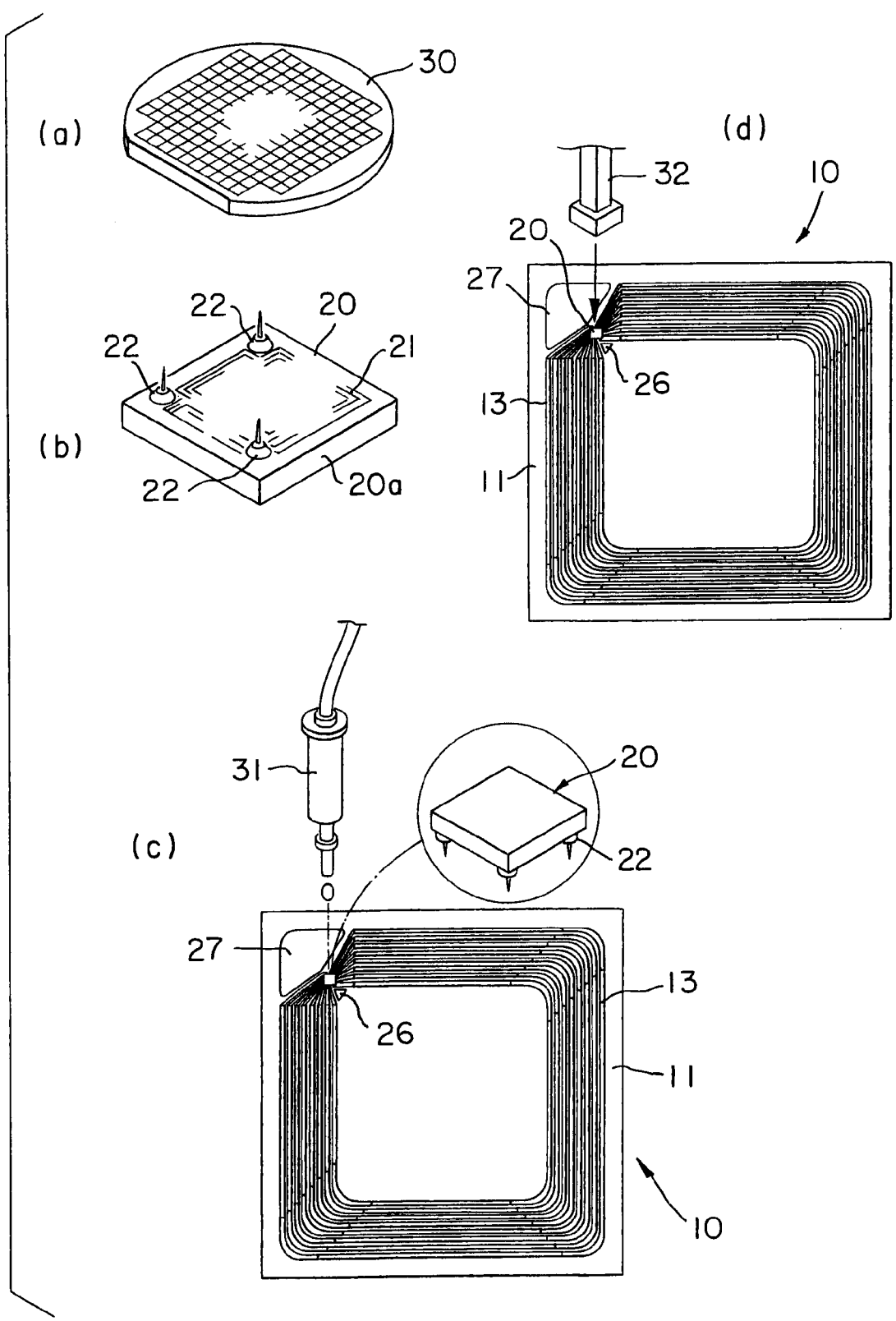
FIG. 4 is a drawing showing a manufacturing method of the non-contact data carrier.

Next, the IC chip 20 will be explained by referring to FIGS. 1 and 3. As shown in FIGS. 1 and 3, the IC chip 20 has an IC chip body 20a, a circuit wiring 21 on the bottom of the IC chip body 20a, and a passivation film 24 covering the circuit wiring 21. Metallic bumps 22 connected to the aluminum antenna coil 13 is provided on the circuit wiring 21 of the IC chip 20. The IC chip 20 has three bumps 22 (FIG. 4), and a pair of bumps 22 among them are connected to the antenna coil 13 as a continuity bump, and the other bump 22 is not connected to the antenna coil 13 and used as a support bump for supporting the IC chip 20.

As mentioned above, the pair of continuity bumps and one support bump, that is, the three bumps 22 in total support the IC chip 20 on the antenna coil 13, thereby the IC chip 20 can be supported stably at the three points free of shaky.

The antenna coil 13 is formed in a coil-shape as shown in FIGS. 4(c) and 4(d) and has a pair of ends. The IC chip 20 is loaded on the antenna coil 13 in a state that a pair of continuity bumps 22 are connected to the pair of ends of the antenna coil 13 and the IC chip 20 is adhered to the antenna coil 13 as a whole via an insulating adhesive (nonconductive paste) 14. Furthermore, the antenna coil 13 and the IC chip 20 are covered with a protective layer 18 made of resin.

Each bump 22 has an almost similar shape and as shown in FIGS. 2(a) and 2(b), has the base 22a positioned on the side of the IC chip body 20a and a projection 22b connected to the base 22a via a shoulder 22c. The projection 22b is held by the base 22a and piercing in and connected to the antenna coil 13.

Generally, an aluminum oxide film 13a is formed on the surface of the aluminum antenna coil 13, and the projection 22b of each bump 22 at least passes through the aluminum oxide film 13a and is connected to the antenna coil 13. Therefore, the continuity between the bump 22 and the antenna coil 13 will not be disturbed by the aluminum oxide film 13a whose continuity is reduced (FIGS. 1 and 3).

In this case, as shown in FIGS. 2(a) and 2(b), the projection 22b of the bump 22 is tapered toward its top so as to easily pierce into the antenna coil 13 and the shoulder 22c is in contact with the aluminum oxide film 13a of the antenna coil 13. Therefore, the bump 22 can be fixed onto the aluminum oxide film 13a stably by the shoulder 22c.

Further, the projection 22b of each bump 22 may be formed in two stages (FIG. 2(a)) and the bump 22 may be formed in one stage (FIG. 2(b)).

Such a bump 22 can be formed by pressing a metal wire against the IC chip body 20a by wire bonding and then pulling up and breaking the same immediately.

Next, the material and shape of each unit will be explained. The resin substrate 11 is made of PET and has a thickness of 38 μm. As the substrate 11, in addition to PET, polypropylene (PP), polyethylene, ABS, styrene, polyimide, glass epoxy, PETG, polycarbonate, paper, PVC, or acrylic resin can be used.

The aluminum antenna coil 13 has a thickness of 30 μm and the aluminum oxide film 13a generally has a thickness of about 500 Å. Therefore, it is desirable that the base 22a of the bump 22 has a height of 10 μm to 100 μm and the projection 22b has a height of 50 μm to 150 μm.

The insulating adhesive 14 is made from, for example, epoxy, acrylic resin, cyanoacrate, or urethane.

Next, the manufacturing method of the non-contact data carrier 10 will be explained by referring to FIGS. 4(a), (b), (c), and (d).

Firstly, as shown in FIG. 4(a), the circuit wiring 21, the bumps 22, and the passivation film 24 are formed on a semiconductor wafer 30. Next, as shown in FIG. 4(b), respective IC chips 20 are separated from the semiconductor wafer 30. On the other hand, the resin substrate is prepared beforehand and the antenna coil 13 is formed on the resin substrate 11 by the etching method using a photoresist layer (FIG. 4(c)). In this case, reinforcement parts 26 and 27 formed of the same material as that of the antenna coil 13 are installed in the neighborhood of the IC chip 20. The pair of ends of the antenna coil 13 are respectively arranged inside and outside the antenna coil 13 on the resin substrate 11, in order to reinforce the strength of the IC chip 20 when pressing it against the antenna coil 13 and prevent the resin substrate 11 from contraction.

Next, the insulating adhesive 14 is coated on the pair of ends of the antenna coil 13 by an adhesive coating machine 31 and the IC chip 20 is loaded on the pair of ends of the antenna coil 13 with the bumps 22 being directed downward.

Next, as shown in FIGS. 4(b) and 6, a compressor 32 is pressed onto the top of the IC chip 20 and the IC chip 20 is contact-bonded on the antenna coil 13 by the compressor 32. In this case, the projection 22b of each bump 22 of the IC chip 20 pierces into and passes through the aluminum oxide film 13a of the antenna coil 13 and the shoulder 22c is in contact with the aluminum oxide film 13a. As a result, the bump 22 can be stably fixed onto the aluminum oxide film 13a by the shoulder 22c.

After the IC chip 20 is loaded and fixed to the antenna coil 13 in the above manner, the protective layer 18 for covering and protecting the antenna coil 13 and the IC chip 20 is provided on the antenna coil 13 and the IC chip 20.

In the embodiment aforementioned, an example that the antenna coil 13 is directly formed on the resin substrate 11 by the IC chip is indicated. However, the present invention is not limited to this manner. As shown in FIG. 5, the antenna coil 13 may be adhered and installed on the resin substrate 11 via a heat seal layer 12. In FIG. 5, the projection 22a of each bump 22 of the IC chip 20 may pass fully through the antenna coil 12 and reach the resin substrate 11. When the projection 22a of each bump 22 passes fully through the antenna coil 12, the bump 22 and the antenna coil 13 can be connected more surely.

Further, an example that the IC chip 20 has three bumps 22 is indicated. However, it may have more than three bumps, for example, four or five bumps.

As mentioned above, according to the present invention, the IC chip bumps are connected to the antenna coil by piercing their projections into the antenna coil, so that even if an oxide film is formed on the antenna coil surface, the continuity between the bumps and the antenna coil can be surely realized. Therefore, a non-contact data carrier which is satisfactorily conductive and highly precise can be provided.

What is claimed is:

1. A non-contact data carrier comprising:
    a resin film substrate,
    a metallic antenna coil provided on said resin film substrate,
    an insulating adhesive provided on said metallic antenna coil, and
    an IC chip having an IC chip body, circuit wiring, and a plurality of bumps connected to said antenna coil, wherein
        (a) each bump of said IC chip has a projection connected to said antenna coil,
        (b) the projection has a triangular cross section that comes to a point, and
        (c) the projection pierces through said insulating adhesive and said antenna coil to reach said resin film substrate.

2. A non-contact data carrier according to claim 1, wherein
    each bump of said IC chip has a base positioned on a side of said IC chip body and said base holds said projection via a shoulder.

3. A non-contact data carrier according to claim 1, wherein
    said IC chip has three bumps, and a pair of bumps among said bumps are continuity bumps, and the other bump is a support bump.

4. A non-contact data carrier according to claim 1, wherein
    an insulating adhesive is provided between said antenna coil and said IC chip.

5. A non-contact data carrier according to claim 1, wherein
    said projection of each bump of said IC chip passes through said antenna coil and reaches said substrate.

6. A non-contact data carrier according to claim 1, wherein
    a protective layer made of resin covering said antenna coil and said IC chip is provided on said substrate.

7. A non-contact data carrier according to claim 1, wherein
    an oxide film is formed on a surface of said antenna coil and said projection of each bump at least passes through said oxide film on said surface of said antenna coil.

* * * * *